(12) United States Patent
Hanaoka et al.

(10) Patent No.: US 7,939,433 B2
(45) Date of Patent: *May 10, 2011

(54) METHOD FOR PRODUCING NITRIDE SEMICONDUCTOR LASER LIGHT SOURCE AND APPARATUS FOR PRODUCING NITRIDE SEMICONDUCTOR LASER LIGHT SOURCE

(75) Inventors: Daisuke Hanaoka, Kyoto (JP); Masaya Ishida, Kashihara (JP); Atsushi Ogawa, Higashihiroshima (JP); Yoshihiko Tani, Mihara (JP); Takuro Ishikura, Kashihara (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/656,758

(22) Filed: Feb. 16, 2010

(65) Prior Publication Data

US 2010/0197056 A1    Aug. 5, 2010

Related U.S. Application Data

(62) Division of application No. 11/889,767, filed on Aug. 16, 2007, now Pat. No. 7,691,729, which is a division of application No. 11/237,946, filed on Sep. 29, 2005.

(30) Foreign Application Priority Data

Sep. 30, 2004  (JP) ................. 2004-286719
Oct. 13, 2004  (JP) ................. 2004-298408
Sep. 2, 2005   (JP) ................. 2005-255356
Sep. 9, 2005   (JP) ................. 2005-262785

(51) Int. Cl.
*H01L 21/20* (2006.01)
(52) U.S. Cl. ............. 438/478; 438/21; 438/26; 438/28; 438/41; 438/200; 257/E21.121

(58) Field of Classification Search .................. 438/518
See application file for complete search history.

(56) References Cited

U.S. PATENT DOCUMENTS 6,396,023 B1    5/2002  Aikiyo
6,991,952 B2    1/2006  Mizuno et al.
7,129,163 B2 *  10/2006 Sherrer et al. ............ 438/637
(Continued)

FOREIGN PATENT DOCUMENTS

JP    2002-75965    3/2002
(Continued)

OTHER PUBLICATIONS

Office Action dated Sep. 30, 2008 in U.S. Appl. No. 11/237,946 (parent case).
(Continued)

*Primary Examiner* — N Drew Richards
*Assistant Examiner* — Kyoung Lee
(74) *Attorney, Agent, or Firm* — Harness, Dickey & Pierce, P.L.C.

(57) ABSTRACT

A method for producing a nitride semiconductor laser light source is provided. The nitride semiconductor laser light source has a nitride semiconductor laser chip, a stem for mounting the laser chip thereon, and a cap for covering the laser chip. The laser chip is encapsulated in a sealed container composed of the stem and the cap. The method for producing this nitride semiconductor laser light source has a cleaning step of cleaning the surface of the laser chip, the stem, or the cap. In the cleaning step, the laser chip, the stem, or the cap is exposed with ozone or an excited oxygen atom, or baked by heat. The method also has, after the cleaning step, a capping step of encapsulating the laser chip in the sealed container composed of the stem and the cap. During the capping step, the cleaned surface of the laser chip, the stem, or the cap is kept clean. This method provides a long-life nitride semiconductor laser light source the light emission intensity of which is not easily reduced after a long period of use.

14 Claims, 6 Drawing Sheets

U.S. PATENT DOCUMENTS

| | | | |
|---|---|---|---|
| 7,220,995 B2 * | 5/2007 | Noguchi et al. | 257/79 |
| 2002/0043331 A1 | 4/2002 | Uemura et al. | |
| 2003/0214987 A1 | 11/2003 | Yamanaka et al. | |
| 2004/0087048 A1 * | 5/2004 | Mizuno et al. | 438/22 |
| 2004/0184753 A1 | 9/2004 | Teramura et al. | |
| 2005/0153478 A1 * | 7/2005 | Yoshida et al. | 438/106 |

FOREIGN PATENT DOCUMENTS

| | | |
|---|---|---|
| JP | 2002-75965 A | 3/2002 |
| JP | 2003-163382 | 6/2003 |
| JP | 2004-14820 | 1/2004 |
| JP | 2004-14820 A | 1/2004 |
| JP | 2004-273908 | 9/2004 |
| JP | 2004-273908 A | 9/2004 |

OTHER PUBLICATIONS

Office Action, dated May 13, 2009, from parent U.S. Appl. No. 11/237,946.

Office Action dated Apr. 16, 2009 in U.S. Appl. No. 11/889,776.

* cited by examiner

-PRIOR ART-

US 7,939,433 B2

METHOD FOR PRODUCING NITRIDE SEMICONDUCTOR LASER LIGHT SOURCE AND APPARATUS FOR PRODUCING NITRIDE SEMICONDUCTOR LASER LIGHT SOURCE

PRIORITY STATEMENT

This application is a divisional claiming priority under 35 U.S.C. §121 to U.S. application Ser. No. 11/889,767, filed on Aug. 16, 2007 now U.S. Pat. No. 7,691,729, which is a divisional claiming priority under 35 U.S.C. §121 to co-pending U.S. application Ser. No. 11/237,946, filed on Sep. 29, 2005, which claims priority under 35 U.S.C. §119 to Japanese Patent Application No. 2004-286719, filed on Sep. 30, 2004, Japanese Patent Application No. 2004-298408, filed on Oct. 13, 2004, Japanese Patent Application No. 2005-255356, filed on Sep. 2, 2005, and Japanese Patent Application No. 2005-262785, filed on Sep. 9, 2005, the contents of each of which are hereby incorporated herein by reference in their entirety.

BACKGROUND OF THE INVENTION

1) Field of the Invention

The present invention relates to a method for producing a nitride semiconductor laser light source that has a long life, and to an apparatus for producing the nitride semiconductor laser light source.

2) Description of the Related Art

Semiconductor laser light sources with short wavelengths of the near-ultraviolet and ultraviolet regions are generally produced by encapsulating a nitride semiconductor laser chip in the inner space of a cap that allows laser light to transmit therethrough, so that the laser chip is shielded from the ambient atmosphere. There is such a problem that at the time of production, contaminants intrude into the inner space of the cap and attach to the facet of the resonator of the laser chip, resulting in deteriorated laser characteristics.

The contaminants mean hydrocarbon compounds and siloxane, often contained in the ambient atmosphere or generated in the course of production of the laser light source and diffused in the production atmosphere. Thus, the contaminants attach to the laser chip and cap during the production of the laser light source, and even if a fresh atmosphere is used when encapsulating the laser chip in the cap, the contaminants cannot be prevented from intruding into the cap to be contained therein.

In some cases, contaminants such as hydrocarbon compounds and siloxane are originally adhered to the constituent members of the laser light source. If the laser light source is produced without any treatment, the contaminants remain inside the cap.

In addition, heat is generated when driving the laser, and because this driving heat causes convection of the contaminants in the encapsulated atmosphere, many of the contaminants are ionized by exposure to short wavelength laser light. The ionized contaminants are adsorbed intensively and strongly to the facet of the laser chip causing the facet of the resonator to deteriorate. This reduces with time the light emission intensity of the laser light source.

To remove the contaminants floating in the encapsulated atmosphere for the purpose of preventing the facet of the resonator from deteriorating, a technique is proposed in Japanese Patent Application Publication No. 2004-14820 such that as shown in FIG. 4, zeolite adsorbent 48 is provided in cap 43 of laser light source 47.

This technique will be described using the drawing. As shown in FIG. 4, semiconductor laser light source 47 has nitride semiconductor laser chip 45, chip-equipped portion 41 for supporting laser chip 45, stem 40 for mounting laser chip 45 thereon, bell-shaped cap 43 having, in a top portion, window portion 44 for laser light to transmit therethrough, and light detecting element 46. Semiconductor laser light source 47 is formed by encapsulating laser chip 45 in a sealed container that is in turn formed by adhering cap 43 to stem 40. On the lower surface of stem 40, electrode lead wires 42 are provided.

However, as a result of a study carried out by the present inventors, it has been found that even when using the above technique, the contaminants in the encapsulated atmosphere cannot be sufficiently removed by adsorption, and when operated for a long period of time, the facet of the laser chip deteriorates.

SUMMARY OF THE INVENTION

It is an object of the present invention to provide a method for producing a long-life type nitride semiconductor laser light source the light emission intensity of which is not easily reduced after a long period of use, and to provide an apparatus for producing the nitride semiconductor laser light source.

(1) In order to accomplish the above and other objects, a method for producing a nitride semiconductor laser light source according to a first aspect of the present invention is configured as follows.

A method for producing a nitride semiconductor laser light source is provided. The nitride semiconductor laser light source comprises a nitride semiconductor laser chip, a stem for mounting the laser chip thereon, and a cap for covering the laser chip. The laser chip is encapsulated in a sealed container composed of the stem and the cap. The method comprises the steps of: a baking step of cleaning a surface of the laser chip, the stem, or the cap, the baking step comprising heating the laser chip, the stem, or the cap in a first atmosphere; and a capping step of, after the baking step, encapsulating the laser chip in the sealed container composed of the stem and the cap, the capping step being carried out in a second atmosphere. The second atmosphere is of a kind identical to or different from the first atmosphere.

With this structure, since the laser chip is encapsulated in the sealed container after contaminants have been removed out of the sealed container composed of the stem and cap and off the surface of the laser chip by carrying out the baking step prior to the capping step, the amount of the contaminants incorporated in the sealed container at the time of production of the laser light source is significantly reduced. Thus, even in the case of a long period of use under high temperature, deterioration does not easily occur on the facet of the resonator of the laser chip by polymerization or decomposition of the contaminants, and the deterioration with time of the light emission intensity is reduced. This enables the long-time operation of the nitride semiconductor laser light source.

The method for producing a nitride semiconductor laser light source according to the first aspect of the present invention may be such that the first atmosphere and the second atmosphere each have a vacuum.

The term vacuum is intended to mean an atmosphere of an atmospheric pressure of 1×133.322 Pa (1 Torr) or lower.

The method for producing a nitride semiconductor laser light source according to the first aspect of the present invention may be such that the first atmosphere comprises only an inert gas; and the second atmosphere comprises an inert gas of a kind identical to or different from the inert gas of the first atmosphere.

That the atmospheres have a vacuum or an inert gas is preferable in that the atmosphere gas does not adversely affect the baking and capping.

The method for producing a nitride semiconductor laser light source according to the first aspect of the present invention may be such that the first atmosphere comprises an inert gas, or an inert gas and oxygen gas; and the second atmosphere comprises an inert gas and oxygen gas.

When oxygen gas is added in the second atmosphere, which is an encapsulation gas for use in encapsulating the laser chip in the sealed container composed of the stem and cap, laser chip characteristics such as electrical characteristics are stabilized when the laser light source is operated for a long period of time. The oxygen gas concentration in the second atmosphere is preferably 100 ppm or higher and 80% or lower, more preferably from 0.1% to 40%, and most preferably from 1% to 18%. If the oxygen gas concentration is too low, the effect of characteristics stabilization is not sufficiently obtained. If the oxygen gas concentration is too high, the oxygen gas is feared to adversely affect laser chip characteristics.

Even if oxygen gas in the above range is contained in the first atmosphere, which is used in the baking step, the laser light source is not adversely affected.

The method for producing a nitride semiconductor laser light source according to the first aspect of the present invention may be such that the first atmosphere and the second atmosphere each have dry air with a moisture concentration of 1000 ppm or lower.

Because dry air (ambient atmosphere) with a moisture concentration of 1000 ppm or lower is mainly composed of approximately 78% nitrogen gas (inert gas), approximately 21% oxygen gas, and approximately 1% argon gas (inert gas), advantageous effects similar to those obtained when using the above-described mixture of inert gas and oxygen gas are obtained, and the production cost is reduced compared with the case of using an inert gas or a mixture gas of inert gas and oxygen gas.

By making the moisture concentration 1000 ppm or lower, even if contaminants are incorporated in the dry air, the deterioration (contamination) of the facet is inhibited and the advantageous effects of the present invention are obtained.

The method for producing a nitride semiconductor laser light source according to the first aspect of the present invention may be such that the first atmosphere or the second atmosphere comprises nitrogen gas or helium gas.

With this structure, by using helium gas as a heat radiation medium taking advantage of its high heat conductivity, heat damage during driving of the nitride semiconductor laser chip is significantly reduced. On the other hand, because nitrogen gas is cheaper than other inert gases, the use of nitrogen gas for the inert gas reduces the production cost of the laser light source.

The method for producing a nitride semiconductor laser light source according to the first aspect of the present invention may be such that the first atmosphere and the second atmosphere comprise identical kinds of gases.

With this structure, since identical kinds of atmospheres are used throughout the production process of the laser light source, work associated with supply of gas is simplified, and the laser light source is produced cheaply compared with the use of a plurality of different kinds of gases.

The method for producing a nitride semiconductor laser light source according to the first aspect of the present invention may be such that the pressure of the second atmosphere is 760×133.322 Pa or lower.

With this structure, by filling the capping portion with gas at a pressure of 760×133.322 Pa (760 Torr) or lower, the pressure inside the sealed container of the completed laser light source is made equal to or lower than the ambient atmosphere pressure to thereby enhance the adhesivity of the cap after sealing.

The method for producing a nitride semiconductor laser light source according to the first aspect of the present invention may be such that the nitride semiconductor laser chip has a light emission wavelength of 420 nm or shorter.

When contaminants are incorporated inside the laser light source, the facet of the resonator of the laser chip tends to deteriorate as the light emission wavelength of the laser light source becomes shorter. However, with the above structure, while using a laser chip of a very short wavelength of 420 nm or shorter, which is a light emission wavelength in the blue-to-ultraviolet regions, since contaminants are not easily incorporated inside the sealed container at the time of production of the laser light source, the facet of the resonator of the laser chip is prevented from deteriorating.

If the treatment temperature is lower than 100° C., organic compounds and siloxane are not sufficiently decomposed and evaporated, and thus the surface of each constituent member of the laser light source cannot be cleaned. On the other hand, if the treatment temperature exceeds 500° C., heat damage occurs on the nitride semiconductor laser chip, and the cap and stem are deformed by heat. In the baking step, therefore, the laser chip, stem, or cap is preferably heated in the range between 100° C. and 500° C. In the case where the treatment temperature exceeds 350° C., there is a high risk of the solder that joints the constituent members being melted by heat and thereby the laser light source being broken. When the treatment temperature is set at 200° C. or higher, organic compounds and siloxane are reliably decomposed and evaporated. Thus, more preferably, the heating temperature in the baking step is from 200° C. to 350° C.

Although the baking time can be selected arbitrarily from the range between 10 minutes and 24 hours, adjustment needs to be carried out considering the trade-off between the treatment temperature and the treatment time, examples including setting the time at 10 minutes when the temperature is 500° C., 30 minutes for a temperature of 350° C., 2 hours for a temperature of 200° C., and 24 hours for a temperature of 100° C.

(2) An apparatus for producing a nitride semiconductor laser light source which realizes the method for producing a nitride semiconductor laser light source according to the first aspect of the present invention is configure as follows.

An apparatus for producing a nitride semiconductor laser light source comprises: a baking furnace for cleaning a surface of a nitride semiconductor laser chip, a stem for mounting the laser chip thereon, or a cap for covering the laser chip, the baking furnace heating the laser chip, the stem, or the cap in a first atmosphere; and a capping portion for encapsulating, in a second atmosphere, the laser chip with a cleaned surface in a sealed container composed of the stem and the cap each with a cleaned surface. The second atmosphere is of a kind identical to or different from the first atmosphere.

(3) In order to solve the above-described and other problems, a method for producing a nitride semiconductor laser light source according to a second aspect of the present invention is configured as follows.

A method for producing a nitride semiconductor laser light source is provided. The nitride semiconductor laser light source comprises a nitride semiconductor laser chip, a stem for mounting the laser chip thereon, and a cap for covering the laser chip. The laser chip is encapsulated in a sealed container composed of the stem and the cap. The method comprises the steps of an ashing step of cleaning a surface of the laser chip, the stem, or the cap, the ashing step comprising exposing the surface of the laser chip, the stem, or the cap with ozone or an excited oxygen atom; and a capping step comprising: after the ashing step, supplying a first gas onto the surface of the laser chip, the stem, and the cap; and encapsulating, in an atmosphere of the first gas, the laser chip in a sealed container composed of the stem and the cap.

The method for producing a nitride semiconductor laser light source according to the second aspect of the present invention is configured approximately the same as the method for producing a nitride semiconductor laser light source according to the first aspect except that the cleaning treatment is carried out by, instead of baking with the use of heat, ashing with the use of exposure of ozone or an excited oxygen atom.

With this structure, since the laser chip is encapsulated in the sealed container after contaminants have been removed out of the sealed container composed of the stem and cap and off the surface of the laser chip by carrying out the ashing step prior to the capping step, the amount of the contaminants incorporated in the sealed container is significantly reduced, as in the first aspect of the present invention. Thus, even in the case of a long period of use under high temperature, deterioration does not easily occur on the facet of the resonator of the laser chip by polymerization or decomposition of the contaminants, and the deterioration with time of the light emission intensity is reduced. This enables the long-time operation of the nitride semiconductor laser light source.

The method for producing a nitride semiconductor laser light source according to the second aspect of the present invention may be such that the first gas comprises only an inert gas.

The method for producing a nitride semiconductor laser light source according to the second aspect of the present invention may be such that the first gas comprises an inert gas and oxygen gas.

The method for producing a nitride semiconductor laser light source according to the second aspect of the present invention may be such that the first gas has dry air with a moisture concentration of 1000 ppm or lower.

When an inert gas is used for the first gas, which is an encapsulation gas, the semiconductor laser light source is not adversely affected.

Also, when oxygen gas is added in the first gas, which is an encapsulation gas, as described in relation to the production method according to the first aspect, laser chip characteristics such as electrical characteristics are stabilized when the laser light source is operated for a long period of time. A preferable range for the oxygen gas concentration is the same as in the production method according to the first aspect.

Also, the effects of using, as the first gas, dry air with a moisture concentration of 1000 ppm or lower are the same as in the production method according to the first aspect.

The method for producing a nitride semiconductor laser light source according to the second aspect of the present invention may be such that the nitride semiconductor laser chip has a light emission wavelength of 450 nm or shorter.

When contaminants are incorporated inside the laser light source, the facet of the resonator of the laser chip tends to deteriorate as the light emission wavelength of the laser light source becomes shorter. However, with the above structure, while using a laser chip of a wavelength of 450 nm or shorter, and further, 420 nm or shorter, which are light emission wavelengths in the blue-to-ultraviolet regions, since contaminants are not easily incorporated inside the sealed container at the time of production of the laser light source, the facet of the resonator of the laser chip is prevented from deteriorating.

The method for producing a nitride semiconductor laser light source according to the second aspect of the present invention may be such that the cleaning treatment in the ashing step comprises oxidizing and decomposing a contaminant adhered to the surface of the laser chip, the stem, or the cap using the ozone or the excited oxygen atom, thereby removing the contaminant off the surface of the laser chip, the stem, or the cap.

Excited oxygen atoms (O (1D)) and ozone have strong oxidizing force, and thus with the above structure in which ozone or an excited oxygen atom is exposed to a contaminant such as siloxane and an organic compound adhered to each constituent member of the laser light source, the contaminant is gasified by oxidization and decomposition and scattered off the surface of each constituent member into the atmosphere of the ashing treatment equipment, thereby cleaning the surface of each constituent member.

The ozone can be generated by using a known ozone-gas generating method, and the excited oxygen atom can be generated by irradiating oxygen gas or ozone gas with ultraviolet light.

The method for producing a nitride semiconductor laser light source according to the second aspect of the present invention may be such that the excited oxygen atom is generated by irradiating the oxygen gas supplied onto the surface of the laser chip, the stem, or the cap with ultraviolet light.

With this structure, radiation of ultraviolet light cuts the molecule combination of organic contaminants. This promotes the decomposition effect of the contaminant realized by the strong oxidizing force of the ozone and excited oxygen atom.

The method for producing a nitride semiconductor laser light source according to the second aspect of the present invention may be such that the ashing step comprises supplying a second gas containing an inert gas onto the surface of the laser chip, the stem, or the cap.

The inert gas or the second gas may comprise nitrogen gas or helium gas.

The method for producing a nitride semiconductor laser light source according to the second aspect of the present invention may be such that the first gas and the second gas comprise identical kinds of gases.

The operations and effects of the above-described structures are the same as in the production method according to the first aspect of the present invention.

The method for producing a nitride semiconductor laser light source according to the second aspect of the present invention may further comprise, between the ashing step and the capping step, a step of supplying only the first gas, the inert gas, or the second gas onto the surfaces of the laser chip, the stem, and the cap.

With this structure, during the time between the ashing step and the completion of the capping step, the laser chip, stem, and cap, which are main constituent members of the laser light source, are not exposed to the ambient atmosphere but always kept in a sealed state. Contaminants therefore do not re-adhere to the cleaned surfaces of the members. Thus, contaminants are reliably prevented from intruding into the sealed container at the time of device production, thereby enabling the further long-time operation of the laser light source.

The method for producing a nitride semiconductor laser light source according to the second aspect of the present invention may be such that the treatment temperature during the ashing step is from 100° C. to 500° C.

With this structure, in addition to an accelerated increase in the oxidization activity of the excited oxygen atom and the like upon increase in the treatment temperature, by making the treatment temperature during the ashing step 100° C. or higher, moisture is evaporated off the surface of each member. Insofar as the treatment temperature is 500° C. or lower, the promoting effect of the cleaning treatment is obtained without heat damage on the nitride semiconductor laser chip and heat deformation of the cap and stem.

The method for producing a nitride semiconductor laser light source according to the second aspect of the present invention may be such that the treatment temperature during the ashing step is from 200° C. to 350° C.

When the treatment temperature is set at 200° C. or higher, the baking effect of decomposing and evaporating organic compounds and siloxane is obtained. On the other hand, when the treatment temperature exceeds 350° C., there is a high risk of the solder that joints the constituent members being melted by heat and thereby the laser light source being broken. It is therefore preferable to make the treatment temperature from 200° C. to 350° C.

The method for producing a nitride semiconductor laser light source according to the second aspect of the present invention may be such that the pressure of the first inert gas is 760×133.322 Pa or higher.

With this structure, by filling the capping portion with the inert gas at a pressure of 760×133.322 Pa (760 Torr) or higher, the pressure inside the sealed container of the completed laser light source is made higher than the ambient atmosphere pressure. This prevents the ambient atmosphere from flowing into the sealed container, that is, contaminants are prevented from intruding into the sealed container.

The method for producing a nitride semiconductor laser light source according to the second aspect of the present invention may be such that the laser chip is mounted on the stem being subject to ashing in the ashing step.

With this structure, it is not necessary to mount the laser chip on the stem in the capping step. This eliminates the need for carrying out the capping step, by which the laser chip is encapsulated in the sealed container, in a sealed environment for the purpose of preventing adherence of contaminants. Thus, the process for production of the laser light source and associated equipment are facilitated.

The method for producing a nitride semiconductor laser light source according to the second aspect of the present invention may be such that the ashing step comprises cleaning surfaces of all members encapsulated in the sealed container.

With this structure, incorporation of contaminants in the sealed container is further reliably prevented during device production.

The method for producing a nitride semiconductor laser light source according to the second aspect of the present invention may further comprise a step of, before the ashing step, heating the surface of the laser chip, the stem, or the cap to 200° C. or higher and 350° C. or lower, or a step of, after the ashing step and before the capping step, heating the surface of the laser chip, the stem, or the cap to 200° C. or higher and 350° C. or lower.

As described in relation to the production method according to the first aspect, since gases containing contaminants such as hydrocarbon compounds and siloxane are decomposed and evaporated when heated to 200° C. or higher, with the above structures, the contaminants are removed completely off the surfaces of the main constituent members. It should be noted, however, that when the treatment temperature exceeds 350° C., there is a high risk of the solder that joints the constituent members being melted by heat and thereby the laser light source being broken. It is therefore preferable to make the heating temperature 350° C. or lower.

(4) An apparatus for producing a nitride semiconductor laser light source which realizes the method for producing a nitride semiconductor laser light source according to the second aspect of the present invention is configure as follows.

An apparatus for producing a nitride semiconductor laser light source comprises: an ashing treatment equipment for cleaning surfaces of a nitride semiconductor laser chip, a stem for mounting the laser chip thereon, and a cap for covering the laser chip, the treatment equipment exposing the surfaces with an excited oxygen atom; and a capping portion for supplying a first inert gas onto the cleaned surfaces of the laser chip, the stem, and the cap, and for encapsulating the laser chip in a sealed container composed of the stem and the cap in an atmosphere of the first inert gas.

DESCRIPTION OF THE PREFERRED EMBODIMENTS

The present invention will be described by reference to preferred embodiments.

Embodiment 1-1

Figure 1:
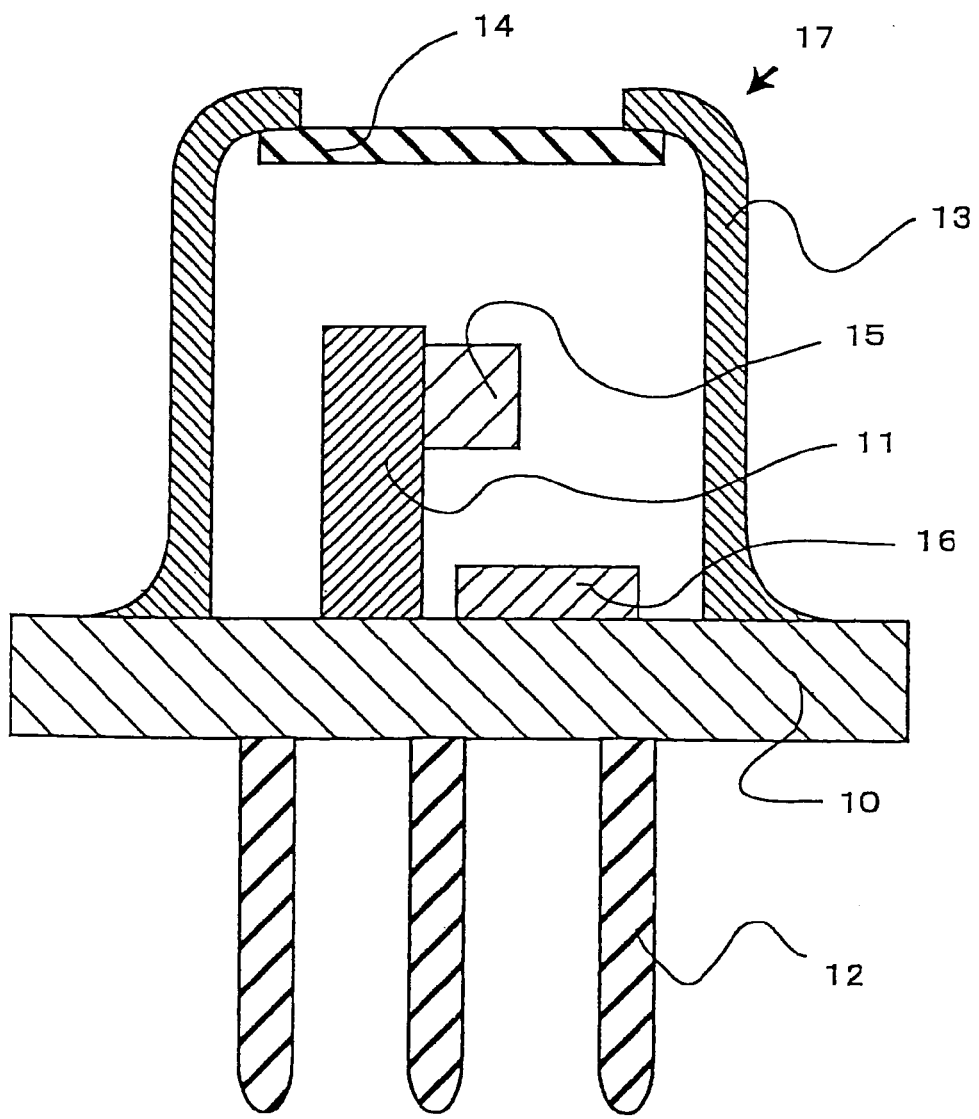
FIG. 1 is a schematic cross section showing an example of the nitride semiconductor laser light source produced by a production method according to the present invention.

FIG. 1 is a schematic cross section showing an outline of the structure of a nitride semiconductor laser light source produced by a method of producing a nitride semiconductor laser light source according to a first aspect of the present invention. As shown in FIG. 1, nitride semiconductor laser light source 17 has nitride semiconductor laser chip 15 with a light emission wavelength of 420 nm or shorter, stem 10 for mounting laser chip 15 thereon, and bell-shaped cap 13. Nitride semiconductor laser light source 17 is formed by encapsulating laser chip 15 in a sealed container that is in turn formed by adhering cap 13 to stem 10. This embodiment describes an example in which an inert gas is used both for a first atmosphere and a second atmosphere. Accordingly, the sealed container is filled with an inert gas (nitrogen gas or helium gas).

The term nitride semiconductor laser chip is intended to mean a nitride semiconductor laser device or a nitride semiconductor super luminescent diode.

Bell-shaped cap 13 has, in a top portion, window portion 14, and through window portion 14, the forward emission laser light of laser chip 15 is emitted outside the light source. On stem 10 is provided light detecting element 16 by which the emission amount of the backward emission laser light of laser chip 15 is detected, so that the emission amount of the laser light is kept uniform by adjusting the driving voltage of the laser chip in a feedback manner.

Laser chip 15 is supported by chip-equipped portion 11 extended from stem 10. This nitride semiconductor laser chip can be mounted on the stem while fixed to a sub-mount. Through stem 10, electrode lead wires 12 are provided. Electrode lead wires 12 are conducted to laser chip 15 and light detecting element 16 such as a photo diode via a connecting wire (not shown).

Nitride semiconductor laser light source 17 was prepared in the following manner.

First, constituent members of nitride semiconductor laser light source 17 were prepared including: stem 10 made of iron and coated with, for example, gold on the surface, with electrode lead wires 12 made of, for example, gold wires penetrating through the principal surface of stem 10; nitride semiconductor laser chip 15 prepared in a known method and having a resonator facet and a light emission wavelength of 420 nm or shorter; bell-shaped cap 13 made of metal and having on its top portion window portion 14 that is made of glass and allows laser light to transmit therethrough; light detecting element 16 such as a photo diode; and a connecting wire. The stem may be such that in order to enhance the radiation of heat generated at the chip during operation, copper, which has high heat conductivity, is provided at the portion of stem 10 where laser chip 15 is directly mounted.

Figure 2:
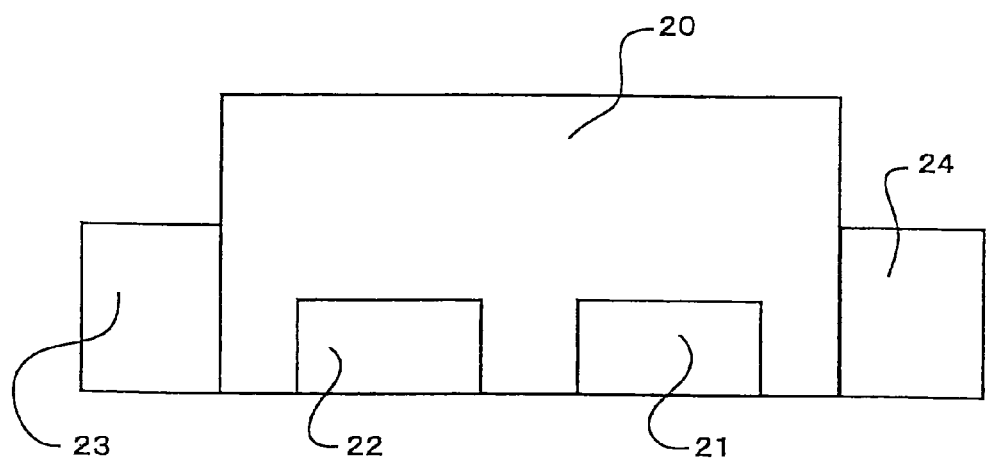
FIG. 2 is a schematic view showing an outline of the structure of an apparatus for producing the laser light source according to a first aspect of the present invention.

The above-described constituent members of the laser light source were placed in baking furnace 22 in an apparatus for producing a laser light source as shown in the outline view of FIG. 2, and then, as described later, the surface of each constituent member was subject to cleaning treatment (baking step). The apparatus for producing a laser light source mainly had main portion 20 housing capping portion 21 and baking furnace 22, and carry-in portion 23 and carry-out portion 24, each provided adjacent to main portion 20.

Figure 3:
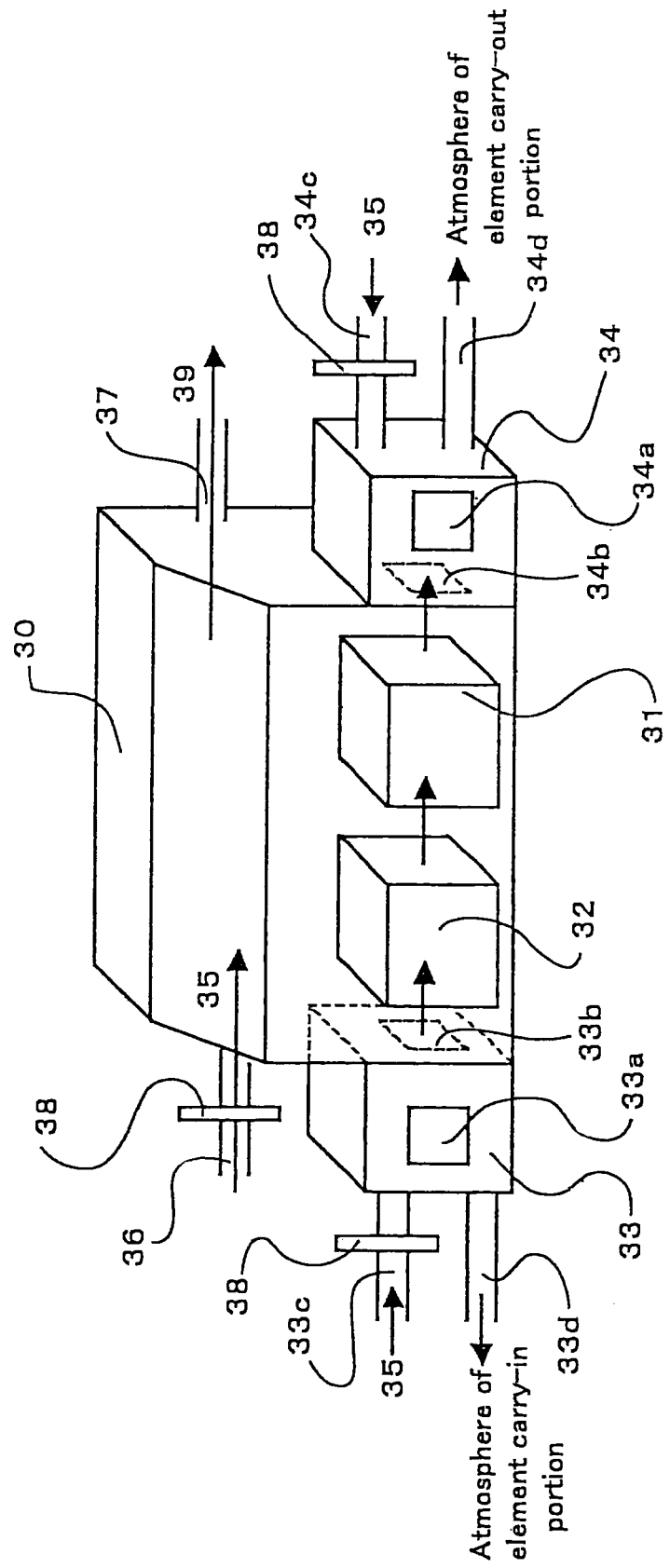
FIG. 3 is a schematic view showing in greater detail the structure of the apparatus for producing the laser light source shown in FIG. 2.
Figure 4:
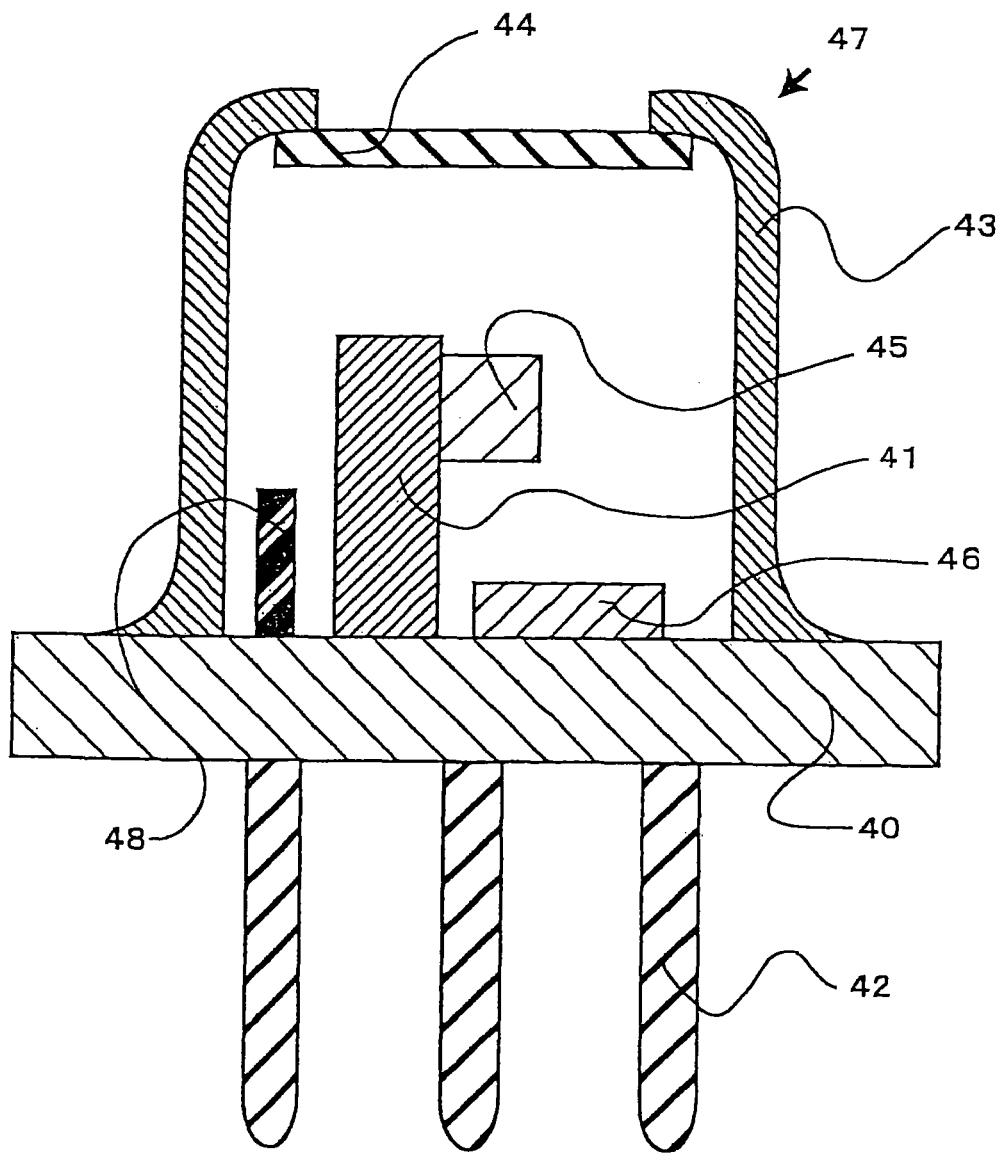
FIG. 4 is a schematic cross section showing an example of a nitride semiconductor laser light source of the prior art.

The structure of the apparatus for producing a laser light source will be described in greater detail. As shown in FIG. 3, provided in main portion 30 having capping portion 31 and baking furnace 32 are inert gas entry port 36 through which inert gas 35 is supplied into the main portion, and inner-main-portion atmosphere exhaust port 37 through which the atmosphere inside the main portion is exhausted outside. In the passage of inert-gas entry port 36, impurity-removing filter 38 is provided by which impurities in inert gas 35 are removed prior to supply thereof into the main portion.

Adjacent to main portion 30, carry-in portion 33 is provided on one side of main portion 30 and carry-out portion 34 is provided on the other side of main portion 30. Carry-in portion 33 has door 33b for controlling conduction and separation between the carry-in portion and the main portion by opening and closing movement. Carry-out portion 34 has door 34b for controlling conduction and separation between the carry-out portion and the main portion. Further, carry-in portion 33 has door 33a for controlling conduction and separation between the outside and the carry-in portion, and carry-out portion 34 has door 34a for controlling conduction and separation between the outside and the carry-out portion.

In addition, carry-in portion 33 has inert-gas entry port 33c through which inert gas 35 is supplied into the carry-in portion, and inner-carry-in-portion atmosphere exhaust port 33d through which the atmosphere inside the carry-in portion is exhausted outside. Carry-out portion 34 has inert-gas entry port 34c through which inert gas 35 is supplied into the carry-out portion, and inner-carry-out-portion atmosphere exhaust port 34d through which the atmosphere inside the carry-out portion is exhausted outside. On each passage of inert-gas entry ports 33c and 34c, impurity-removing filter 38 is provided by which impurities in inert gas 35 are removed.

The cleaning treatment will be described below. As described above, the cleaning treatment by baking is intended to mean that by heating the surface of the target object, contaminants adhered on the surface such as siloxane, organic compounds, and moisture are decomposed and removed in the form of gas.

First, the constituent members of the laser light source including nitride semiconductor laser chip 15 with a light emission wavelength of 420 nm or shorter, stem 10 with laser chip 15 mounted thereon, and cap 13 were carried into carry-in portion 33 through door 33a. Then, in a sealed state with door 33a and door 33b being closed, inert gas 35 was supplied through inert-gas entry port 33c, and the ambient atmosphere components inside the carry-in portion were exhausted outside through exhaust port 33d, so that the carry-in portion was filled with inert gas 35.

Simultaneously, into main portion 30 in a sealed state with door 33b and door 34b being closed, inert gas 35 was supplied through inert-gas entry port 36, and the ambient atmosphere components inside the main portion were exhausted outside through exhaust port 37, so that the main portion was filled with inert gas 35.

Next, door 33b, which was between carry-in portion 33 and main portion 30, was opened to move the constituent members of the laser light source from the carry-in portion to the baking furnace 32. Then, in an inert gas, each constituent member was heated at 300° C. for 24 hours to decompose and remove the contaminants adhered on the surface of each constituent member in the form of gas, thus cleaning each surface (baking step). During the baking step, fresh inert gas is continuously supplied into the main portion, and the atmosphere containing gasified contaminants is exhausted immediately outside the main portion. The scattered contaminants therefore do not re-adhere to the surfaces of the members in the main portion.

The baking temperature at the time of the baking can be selected arbitrarily from the range from 100° C. to 500° C. A reason for this range is that if the treatment temperature is lower than 100° C., organic compounds and siloxane are not sufficiently decomposed and evaporated, making it impossible to clean the constituent members of the laser light source. On the other hand, if the treatment temperature exceeds 500° C., heat damage occurs on the nitride semiconductor laser chip, and the cap and stem are deformed by heat. In the case where the treatment temperature exceeds 350° C., there is a high risk of the solder that joints the constituent members being melted by heat and thereby the laser light source being broken. It is therefore further preferable to set the heating temperature in the baking step at 100° C. to 350° C.

Although the baking time can be selected arbitrarily from the range between 10 minutes and 24 hours, adjustment needs to be carried out considering the trade-off between the treatment temperature and the treatment time, examples including setting the time at 10 minutes when the temperature is 500° C., 30 minutes for a temperature of 350° C., 2 hours for a temperature of 200° C., and 24 hours for a temperature of 100° C.

As the inert gas, it is preferable to use helium gas and nitrogen gas, as described above. A reason for this is that helium gas has very high heat conductivity, and by using helium gas as a heat radiation medium heat damage during operation of the nitride semiconductor laser chip is significantly reduced. Another reason is that because nitrogen gas is cheaper than other inert gases, the use of nitrogen gas for the inert gas reduces the production cost of the laser light source.

Even if only one of the laser chip, stem, and cap is subject to the cleaning treatment in the baking step, intrusion of contaminants into the sealed container at the time of device production can be prevented to some extent. However, to significantly prevent contaminants from intruding into the laser light source, it is preferable to subject the laser chip, stem, and chip collectively to the cleaning treatment, and it is more preferable to clean the surfaces of all the members to be encapsulated in the sealed container. In the case of mounting the laser chip on the stem by fixing the laser chip to a sub-mount, it is of course preferable to clean the sub-mount.

The constituent members of the laser light source having respective surfaces subject to the cleaning treatment in the baking step were moved to capping portion 22, and in an inert gas, bell-shape cap 13 and stem 10 were adhered and sealed with inert gas while housing nitride semiconductor laser chip 15 inside cap 13, thus constructing nitride semiconductor laser light source 17 as shown in FIG. 1 (capping step).

Subjecting the stem with the laser chip mounted thereon in advance to the cleaning treatment is preferable in that it is not necessary to mount the laser chip on the stem in the capping step, so that the encapsulation of the laser chip in the sealed container is simplified.

In the capping step, adjusting the pressure of the inert gas inside the main portion to ambient atmosphere pressure (760×133.322 Pa (760 Torr)) or lower is preferable in that the pressure of the encapsulation gas inside the sealed container becomes that of the ambient atmosphere or lower, so that the adhesivity of the cap after sealing is enhanced.

Next, door 34b, which was between main portion 30 and carry-out portion 34, was opened to move the constructed laser light source to the inside of carry-out portion 34. Lastly, in a sealed state with door 34b and door 34a being closed, inert gas 35 was supplied through inert-gas entry port 34c. Then, after the pressure inside the carry-out portion was adjusted to be equivalent to that of the ambient atmosphere, door 34a was opened and the laser light source was taken out of the carry-out portion.

Using nitride semiconductor laser light source 17 thus prepared, a long-term aging test, in which a laser is continuously driven, was carried out. To carry out the aging test in an accelerated manner, the treatment temperature was set at 60° C. or higher. When the laser was continuously driven at a light output of 30 mW, it has been observed that the laser continued providing light emission at a constant output even after more than 3000 hours of drive, and that the facet of the resonator of the laser chip had not deteriorated, which is a main cause of the deterioration with time of laser characteristics. On the other hand, a conventional laser light source could not be driven for 3000 hours under the same driving conditions.

Figure 5:
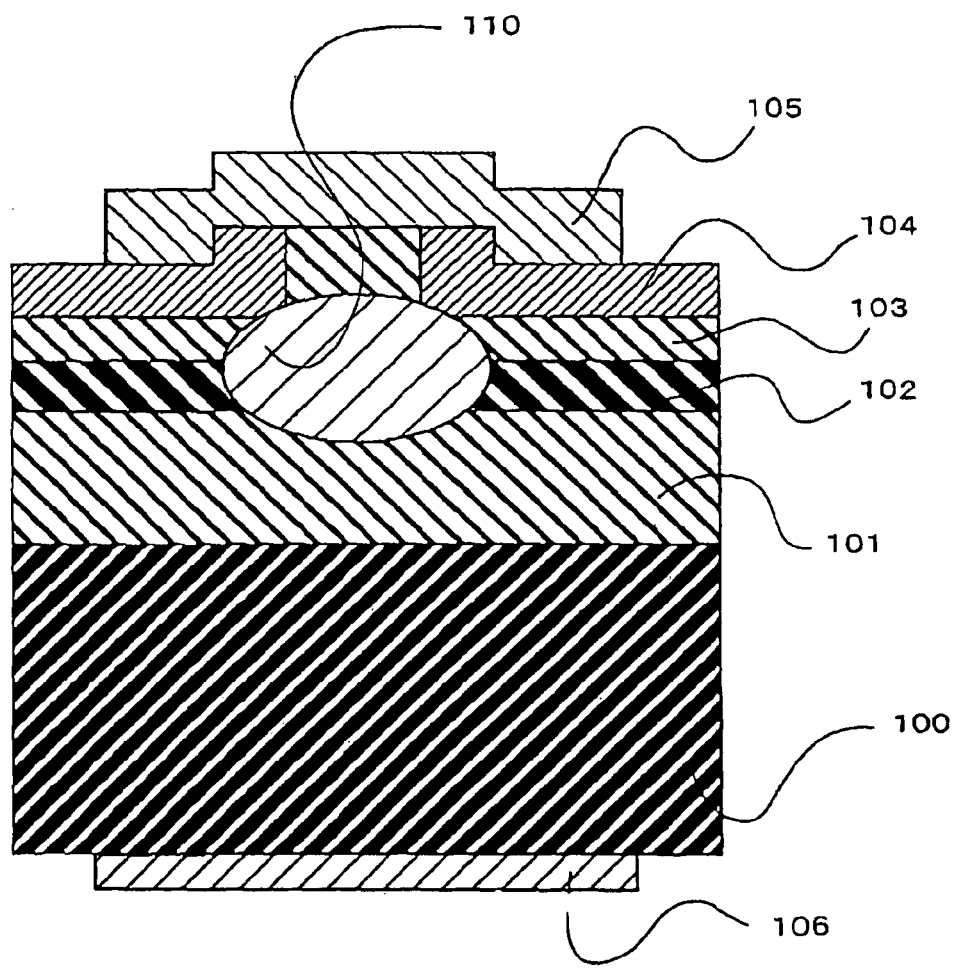
FIG. 5 is a schematic cross section of a nitride semiconductor laser light source in which the laser light emission facet has deteriorated (contamination).

The conventional laser light source was disassembled to examine the laser chip. As shown in FIG. 5, this laser chip had substrate 100, nitride semiconductor layer 101 formed on substrate 100, active layer 102 formed on semiconductor layer 101, nitride semiconductor layer 103 formed on active layer 102, insulation layer 104 formed on semiconductor layer 103, positive electrode 105, and negative electrode 106. It was observed that the resonator facet in the vicinity of active layer 102 of the laser chip had deterioration (contamination) 110.

As a result of a study carried out by the present inventors, it is considered that in a conventional laser light source with zeolite adsorbent, the heat generated during continuous driving causes part of once adsorbed hydrocarbon compounds and siloxane to float off the zeolite adsorbent in the encapsulated atmosphere, and that some contaminants are adhered to the laser facet before adsorbed by the zeolite adsorbent. Thus, an increase in lifetime is inhibited.

In the method for producing the laser light source according to embodiment 1-1, by carrying out the baking step prior to the capping step, in which the laser chip is encapsulated in the sealed container composed of the stem and cap, contaminants are removed away from the inside of the sealed container and the surface of the laser chip. Since this significantly reduces the amount of contaminants contained in the sealed container at the time of the capping, a long-life type nitride semiconductor laser light source as described above is obtained.

Also in the method for producing the laser light source according to embodiment 1-1, during the time between the baking step and completion of the capping step, the constituent members of the laser light source are not exposed to the ambient atmosphere but kept in inert gas in a sealed state. The contaminants are therefore not re-adhered to the cleaned surfaces of the members. Thus, contaminants are reliably prevented from being incorporated in the sealed container at the time of device production.

As the supplied inert gas (second atmosphere) in the capping step, it is possible to use an inert gas of a kind different from the inert gas (first atmosphere) supplied at the time of the baking step. However, it is preferred to use the same kind of inert gas throughout the production process of the laser light source in that work associated with supply of gas is simplified, and that the laser light source is produced cheaply compared with the use of a plurality of different kinds of gases.

In addition, inert gas 35 to be supplied is not limited to the above-described helium gas and nitrogen gas.

As has been described hereinbefore, when contaminants are incorporated inside the laser light source, the facet of the resonator of the laser chip tends to deteriorate remarkably as the light emission wavelength of the laser light source becomes shorter. However, with the method for producing the laser light source according to embodiment 1-1, while using a laser chip of a very short wavelength of 420 nm or shorter, which is a light emission wavelength in the blue-to-ultraviolet regions, since the amount of contaminants incorporated inside the sealed container at the time of production is significantly reduced, the long-time operation of the laser light source is enabled.

Oxygen gas may be added in the second atmosphere, which is an encapsulation gas for use in encapsulating the laser chip in the sealed container composed of the stem and cap. Addition of oxygen gas stabilizes laser chip characteristics such as electrical characteristics when the laser light source is operated for a long period of time. The oxygen gas concentration of the second atmosphere is preferably 100 ppm or higher and 80% or lower, more preferably from 0.1% to 40%, and most preferably from 1% to 18%. If the oxygen concentration is too low, the effect of characteristics stabilization is not sufficiently obtained. If the oxygen concentration is too high, the oxygen gas is feared to deteriorate laser chip characteristics.

The encapsulation gas preferably has low moisture concentration in that with high moisture concentration the moisture in the encapsulated atmosphere causes a tendency of laser chip characteristics to easily deteriorate. Specifically, the moisture concentration is preferably 1000 ppm or lower, more preferably 400 ppm or lower, and most preferably 100 ppm or lower. This range is because by using an inert gas with moisture concentration in the above range, the amount of the $H_2O$ present in the sealed container is reduced, so that the facet of the resonator is prevented from deteriorating, which is considered to result from moisture ionized by exposure of laser light of short wavelength.

With the above considerations combined, the second atmosphere preferably contains nitrogen gas or helium gas as an inert gas, has oxygen gas mixed at the above ratio, and has moisture concentration in the above range.

When, instead of using the inert gas (first atmosphere) supplied at the time of the baking step and the inert gas (second atmosphere) supplied at the time of the capping step, dry air with a moisture concentration of 1000 ppm or lower was used, the same advantageous effects were obtained. It is considered that this is because dry air with a moisture concentration of 1000 ppm or lower is mainly made of an inert gas (approximately 78% nitrogen gas and approximately 1% argon gas) and approximately 21% oxygen gas. In this case, the production cost is reduced compared with the above embodiment, in which an inert gas or a mixture gas of oxygen gas and inert gas is used.

Embodiment 1-2

Embodiment 1-2 according to the first aspect of the present invention is the same as embodiment 1-1 except that the insides of carry-in portion 33, in which the constituent members of the laser light source are kept immediately before moved to main portion 30, and main portion 30 are in a vacuum state (i.e., the first atmosphere and second atmosphere are turned into a vacuum). Accordingly, descriptions also applicable to embodiment 1-1 will not be elaborated upon here. It is noted that the term vacuum is intended to mean an atmosphere of an atmospheric pressure of 1×133.322 Pa (1 Torr) or lower. It is also noted that the sealed container of the resulting laser light source has a vacuum.

The vacuation of the inside of carry-in portion 33 was carried out such that after the constituent members of the laser light source were placed in carry-in portion 33 through door 33a, the ambient atmosphere components in the carry-in portion were exhausted outside in a sealed state with door 33a and door 33b being closed. Simultaneously, in a sealed state with door 33b and door 34b being closed, the ambient atmosphere components in the main portion were exhausted outside through exhaust port 39, thus vacuating the inside of main portion 30.

In the nitride semiconductor laser light source according to embodiment 1-2, the amount of contaminants incorporated in the sealed container at the time of production is significantly reduced, similarly to embodiment 1-1. Therefore, while using a laser chip of a very short wavelength of 420 nm or shorter, which is a light emission wavelength in the ultraviolet region, the long-time operation of the laser light source is enabled. Further, since the sealed container has a vacuum, the adhesivity of the cap after sealing is significantly increased.

Embodiment 2

Next, an embodiment according to a second aspect of the present invention will be described. A nitride semiconductor laser light source produced by the method for producing a nitride semiconductor laser light source according to embodiment 2 is the same as the nitride semiconductor laser light source in embodiment 1-1 except that the light emission wavelength of nitride semiconductor laser chip 15 is 450 nm or shorter, as shown in the schematic view of FIG. 1. Accordingly, descriptions on the members of the nitride semiconductor laser light source will not be provided. This embodiment describes an example in which only an inert gas is used for a first gas.

Method for Producing a Laser Light Source

First, constituent members of nitride semiconductor laser light source 17 were prepared including: stem 10 made of iron and coated with, for example, gold on the surface, with electrode lead wires 12 made of, for example, gold wires penetrating through the principal surface of stem 10; nitride semiconductor laser chip 15 prepared in a known method and having a resonator facet and a light emission wavelength of 450 nm or shorter; bell-shaped cap 13 made of metal and having on its top portion window portion 14 that is made of glass and allows laser light to transmit therethrough; light detecting element 16 such as a photo diode; and a connecting wire. The stem may be such that in order to enhance the radiation of heat generated at the chip during operation, copper, which has high heat conductivity, is provided at the portion of stem 10 where laser chip 15 is directly mounted.

Figure 6:
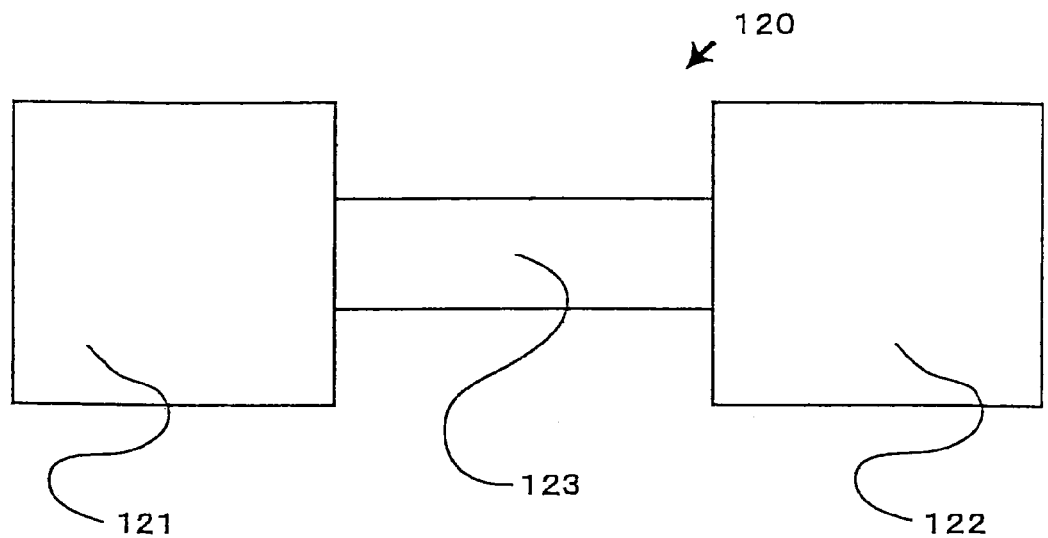
FIG. 6 is a schematic view showing an apparatus for producing a laser light source according to a second aspect of the present invention.

The above-described constituent members of the laser light source were placed in ashing treatment equipment 121 of apparatus 120 for producing a laser light source as shown in the outline view of FIG. 6. Then, as described later, the surface of each constituent member was subject to cleaning treatment (ashing step).

The cleaning treatment will be described. As described above, the cleaning treatment is intended to mean that by exposing the surface of the target object with an excited oxygen atom, the contaminants adhered on the surface such as siloxane, organic compounds, and moisture are oxidized and removed in the form of gas.

First, the atmosphere inside ashing treatment equipment 121 having placed therein the constituent members of the laser light source was adjusted to an oxygen concentration of 100%, ambient atmosphere pressure (760×133.322 Pa), and 200° C.

Next, under this atmosphere, the surface of each constituent member of the laser light source was irradiated with ultraviolet light from a low-pressure mercury lamp, thus subjecting the surface of each member to cleaning treatment. The ultraviolet light had its peak of wavelength in the range 184.9 nm to 253.7 nm. The distance between the sample and the lamp was set at approximately 2 to 10 nm, the radiation intensity was set at approximately 5 to 10 mW/cm², and the radiation time was set at 1 minute to 20 hours.

The cleaning treatment will be described in greater detail. When ultraviolet light under the above radiation conditions is radiated to oxygen gas ($O_2$), the oxygen gas is decomposed and an excited oxygen atom (O (1D)) is generated. Because an excited oxygen atom (O (1D)) has strong oxidization force, when the surface of each constituent member of the laser light source is exposed to the excited oxygen atom, contaminants adhered to the surface of each member such as siloxane and organic compounds are oxidized and decomposed to be gasified, and scattered off the surface of each constituent member in the atmosphere of the ashing treatment equipment. In the ashing treatment equipment, ventilation for a new atmosphere is carried out continuously, and the atmosphere containing gasified contaminants is exhausted immediately outside the ashing treatment equipment. The scattered contaminants therefore do not re-adhere to the surfaces of the members in the ashing treatment equipment.

In the cleaning treatment according to the present invention, it is important to expose the surfaces of the members with highly reactive gas such as the above-described excited oxygen atom. In view of this, other embodiments than the above are possible; for example, the surfaces of the members can be exposed with ozone ($O_3$) generated by using a known ozone-gas generating method or with an excited oxygen atom generated in advance in such a manner that oxygen gas or ozone gas is exposed with ultraviolet light. In this case, irradiating the surfaces of the members with ultraviolet light while exposing the surfaces with ozone and an excited oxygen atom is preferable in that the reactivity of the ozone and excited oxygen atom is further enhanced.

The treatment temperature inside the ashing treatment equipment during the cleaning treatment is preferably from 100° C. to 500° C., and more preferably from 200° C. to 350° C. A reason for this range is that in addition to an accelerated increase in the oxidization activity of the excited oxygen atom and the like upon increase in the treatment temperature, when the treatment temperature is made 200° C. or higher, the cleaning treatment on the surface of each constituent member of the laser light source is promoted by the baking effect of decomposing and evaporating the organic compounds and siloxane. Another reason is that by making the treatment temperature 100° C. or higher, moisture is evaporated off the surface of each member. On the other hand, exceeding 500° C. is not preferable in that heat damage occurs on the nitride semiconductor laser chip, and the cap and stem are deformed by heat. In the case where the treatment temperature exceeds 350° C. there is a high risk of the solder that joints the constituent members being melted by heat and thereby the laser light source being broken.

Insofar as the excited oxygen atom and ozone gas exhibit a sufficient effect of decomposing contaminants, the ashing treatment equipment during the cleaning treatment may contain an inert gas (second gas) composed of nitrogen gas, helium gas, and the like, other than oxygen gas, ozone gas, and excited oxygen atom. Specifically, such an embodiment is possible that a gas in which an inert gas and oxygen gas are mixed together at an oxygen concentration of 5% to 100% is supplied to an ozone-gas generating device attached to the ashing treatment equipment. Because helium gas has high heat conductivity, by using helium gas as a heat radiation medium, heat damage during operation of the nitride semiconductor laser chip is significantly reduced. On the other hand, because nitrogen gas is cheaper than other inert gases, the use of nitrogen gas for the inert gas reduces the production cost of the laser light source.

The time for the cleaning treatment is preferably from 1 minute to 20 hours, as described above. This is because if the treatment time is shorter than 1 minute, contaminants cannot be sufficiently decomposed. On the other hand, the upper limit for the treatment time is not specified. However, because the degree of cleaning becomes practically sufficient after 20 hours of cleaning, the treatment time is preferably in the above range.

Even if only one of the laser chip, stem, and cap is subject to the cleaning treatment in the ashing step, intrusion of contaminants into the sealed container at the time of device production can be prevented to some extent. However, to significantly prevent contaminants from intruding into the laser light source, it is preferable to subject the laser chip, stem, and chip collectively to the cleaning treatment, and it is more preferable to clean the surfaces of all the members to be encapsulated in the sealed container. In the case of mounting the laser chip on the stem by fixing the laser chip to a sub-mount, it is of course preferable to clean the sub-mount.

Next, the steps after the treatment step will be described. In apparatus 120 for producing a laser light source used in this embodiment, ashing treatment equipment 121 and capping portion 122, in which encapsulation of the laser chip in the sealed container composed of the stem and cap is carried out, are independent, and ashing treatment equipment 121 and capping portion 122 are connected together by pass box portion 123 in a hermetic state.

After completion of the cleaning treatment, supply of the excited oxygen atom, ozone, or oxygen gas into the ashing treatment equipment was discontinued. At the same time, an inert gas composed of nitrogen gas, helium gas, and the like was supplied, so that the surface of each constituent member of the laser light source in the ashing treatment equipment was exposed only with the inert gas. An inert gas was supplied to the insides of pass box portion 123 and capping portion 122 at a pressure higher than 760×133.322 Pa, thus making atmosphere gas.

Next, the cleaned constituent members of the laser light source were moved from ashing treatment equipment 121 past pass box portion 123 into capping portion 122. As described above, since ashing treatment equipment 121 and capping portion 122 are connected together hermetically by pass box portion 123, and an inert gas is filled in each portion, the surfaces of the constituent members are not exposed to the ambient atmosphere during the movement. Thus, during the cleaning treatment and the capping step described later, contaminants do not re-adhere to the surfaces of the constituent members.

Lastly, in capping portion 122, bell-shape cap 13 and stem 10 were adhered and sealed with inert gas while housing nitride semiconductor laser chip 15 inside cap 13, thus constructing nitride semiconductor laser light source 17 as shown in FIG. 1 (capping step).

Subjecting the stem with the laser chip mounted thereon in advance to the cleaning treatment is preferable in that it is not necessary to mount the laser chip on the stem in the capping step, so that the encapsulation of the laser chip in the sealed container is simplified.

Using this nitride semiconductor laser light source, a long-term aging test, in which a laser is continuously driven, was carried out. To carry out the aging test in an accelerated manner, the treatment temperature was set at 60° C. or higher. When the laser was continuously driven at a light output of 30 mW, it has been observed that the laser continued providing light emission at a constant output even after more than 3000 hours of drive, and that the facet of the resonator of the laser chip had not deteriorated, which is a main cause of the deterioration with time of laser characteristics. On the other hand, a conventional laser light source could not be driven for 3000 hours under the same driving conditions, and as shown in FIG. 5, deterioration (contamination) 110 was observed on the facet of the resonator of the laser chip.

A reason for the results is considered to be the same as that studied in embodiment 1-1.

In the method for producing the laser light source according to this embodiment, by carrying out the ashing step prior to the capping step, in which the laser chip is encapsulated in the sealed container composed of the stem and cap, contaminants are removed away from the inside of the sealed container and the surface of the laser chip. Since this significantly reduces the amount of contaminants contained in the sealed container at the time of the capping, a nitride semiconductor laser light source with long-life characteristics as described above is obtained.

Also in the method for producing the laser light source according to this embodiment, during the time between the ashing step and completion of the capping step, the constituent members of the laser light source are not exposed to the ambient atmosphere but kept in inert gas in a hermetic state. The contaminants therefore do not re-adhere to the cleaned surfaces of the members. Thus, contaminants are reliably prevented from being incorporated in the sealed container at the time of device production, enabling the further long-time operation of the laser light source.

By filling capping portion 122 with the inert gas at a pressure of 760×133.322 Pa (760 Torr) or higher, the pressure inside the sealed container is adjusted to be higher than the ambient atmosphere pressure. This prevents the ambient atmosphere from flowing into the completed sealed container, that is, contaminants are prevented from intruding into the sealed container. Thus, the long-time operation of the laser light source is enabled.

Insofar as contaminants are prevented from intruding into the sealed container at the time of production of the laser light source, the apparatus for producing the laser light source is not limited to above-described production apparatus 120, in which ashing treatment equipment 121 and capping portion 122 are connected together hermetically by pass box portion 123. For example, such a production apparatus of integral structure may be used that acts both as the ashing treatment equipment and the capping portion without the pass box portion.

As the inert gas supplied after the cleaning treatment, it is possible to use an inert gas of a kind different from the inert gas supplied at the time of the ashing. However, it is preferred to use the same kind of inert gas throughout the production process of the laser light source in that work associated with supply of gas is simplified, and that the laser light source is produced cheaply compared with the use of a plurality of different kinds of inert gases.

Since gases containing contaminants such as hydrocarbon compounds and siloxane are decomposed and evaporated when heated to 200° C. or higher, in order to completely remove the contaminants, it is preferable to heat the laser light source or its constituent members to 200° C. or higher before the ashing step, or after the ashing step and before the capping step. To prevent the solder that joints the constituent members from being melted by heat and causing the laser light source to be broken, it is preferable to set the heating temperature at 350° C. or lower.

When contaminants are incorporated inside the laser light source, the facet of the resonator of the laser chip tends to deteriorate remarkably as the light emission wavelength of the laser light source becomes shorter. However, in this embodiment, while using a laser chip of a very short wavelength of 450 nm or shorter, and further, 420 nm or shorter, which are light emission wavelengths in the blue-to-ultraviolet regions, the long-time operation of the laser light source is enabled.

As in embodiment 1-1, oxygen gas may be added in the encapsulation gas, which is used in encapsulating the laser chip in the sealed container composed of the stem and cap.

The encapsulation gas preferably has low moisture concentration in that with high moisture concentration the moisture in the encapsulated atmosphere causes a tendency of laser chip characteristics to easily deteriorate.

The advantageous effects of addition of oxygen gas and its preferable concentration, and preferable moisture concentration are the same as those in embodiment 1-1.

When, instead of using the inert gas (first atmosphere) supplied at the time of the ashing step and the inert gas (second atmosphere) supplied at the time of the capping step, dry air with a moisture concentration of 1000 ppm or lower was used, the same advantageous effects were obtained. The reason for this is considered to be the same as that studied in embodiment 1-1. In the case of using dry air with a moisture concentration of 1000 ppm or lower, the production cost is reduced compared with the case of using an inert gas or a mixture gas of oxygen gas and inert gas.

In this case, dry air in which impurities such as contaminants are removed by a filter or the like is preferably used. Even when contaminants are contained in the dry air, by making the moisture concentration 1000 ppm or lower, more preferably 400 ppm or lower, and most preferably 100 ppm or lower, the deterioration (contamination) of the facet is inhibited.

As has been described hereinbefore, according to the present invention, since contaminants do not easily intrude into the laser light source during production, the present invention finds applications also in preventing the facet of the resonator of the laser chip from deteriorating. Thus, the present invention, while using a laser chip of a short wavelength of 450 nm or shorter, and further, 420 nm or shorter, which are light emission wavelengths in the blue-to-ultraviolet regions, enables the long-time operation of the laser light source.

What is claimed is:

1. A method for producing a nitride semiconductor laser light source, the nitride semiconductor laser light source including a nitride semiconductor laser chip, a stem for mounting the nitride semiconductor laser chip thereon, and a cap for covering the nitride semiconductor laser chip, the nitride semiconductor laser chip being encapsulated in a sealed container formed by the stem and the cap, the method comprising the steps of:
a baking step of cleaning a surface of at least one of the nitride semiconductor laser chip, the stem, and the cap, the baking step including heating at least one of the nitride semiconductor laser chip, the stem, and the cap at a temperature of about 100° C. to 500° C. in a first atmosphere, the first atmosphere including a first inert gas, the first inert gas and oxygen gas, or dry air with a moisture concentration of about 1000 ppm or lower; and
a capping step performed after the baking step, the capping step including encapsulating the nitride semiconductor laser chip in the sealed container formed of the stem and the cap, the capping step being carried out in a second atmosphere, the second atmosphere including a second inert gas and oxygen gas or dry air with a moisture concentration of about 1000 ppm or lower.

2. The method for producing a nitride semiconductor laser light source according to claim 1, wherein the first atmosphere and the second atmosphere are identical atmospheres.

3. The method for producing a nitride semiconductor laser light source according to claim 1, wherein each of the first and second inert gases is a nitrogen gas or a helium gas.

4. The method for producing a nitride semiconductor laser light source according to claim 1, wherein a pressure of the second atmosphere is about 760×133.322 Pa or lower.

5. The method for producing a nitride semiconductor laser light source according to claim 1, wherein the nitride semiconductor laser chip has a light emission wavelength of about 420 nm or less.

6. The method for producing a nitride semiconductor laser light source according to claim 1, wherein the temperature during the baking step is between about 200° C. to 350° C.

7. The method for producing a nitride semiconductor laser light source according to claim 1, wherein a duration of the heating is between about 10 minutes to 24 hours.

8. The method for producing a nitride semiconductor laser light source according to claim 1, wherein a duration of the heating is between about 30 minutes to 2 hours.

9. The method for producing a nitride semiconductor laser light source according to claim 1, wherein a duration of the heating ranges from about 10 minutes when the temperature is about 500° C. to about 24 hours when the temperature is about 100° C.

10. The method for producing a nitride semiconductor laser light source according to claim 1, wherein a duration of the heating ranges from about 30 minutes when the temperature is about 350° C. to about 2 hours when the temperature is about 200° C.

11. The method for producing a nitride semiconductor laser light source according to claim 1, wherein a concentration of the oxygen gas in the second atmosphere ranges from about 0.1% to 40%.

12. The method for producing a nitride semiconductor laser light source according to claim 1, wherein a concentration of the oxygen gas in the second atmosphere ranges from about 1% to 18%.

13. The method for producing a nitride semiconductor laser light source according to claim 1, wherein the moisture concentration of the second atmosphere is about 400 ppm or lower.

14. The method for producing a nitride semiconductor laser light source according to claim 1, wherein the moisture concentration of the second atmosphere is about 100 ppm or lower.

* * * * *